(12) United States Patent
Ray

(10) Patent No.: US 9,147,554 B2
(45) Date of Patent: Sep. 29, 2015

(54) USE OF BEAM SCANNING TO IMPROVE UNIFORMITY AND PRODUCTIVITY OF A 2D MECHANICAL SCAN IMPLANTATION SYSTEM

(75) Inventor: Andy Ray, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 920 days.

(21) Appl. No.: 12/826,050

(22) Filed: Jun. 29, 2010

(65) Prior Publication Data

US 2011/0001059 A1  Jan. 6, 2011

Related U.S. Application Data

(60) Provisional application No. 61/222,671, filed on Jul. 2, 2009.

(51) Int. Cl.
*H01J 37/317* (2006.01)
*H01J 37/147* (2006.01)
*H01J 37/20* (2006.01)

(52) U.S. Cl.
CPC ......... *H01J 37/3171* (2013.01); *H01J 37/1472* (2013.01); *H01J 37/20* (2013.01); *H01J 2237/20228* (2013.01); *H01J 2237/24542* (2013.01)

(58) Field of Classification Search
CPC ... H01J 37/3171; H01J 37/20; H01J 37/1472; H01J 2237/24542; H01J 2237/20228
USPC ...... 250/396 R, 396 ML, 400, 492.1, 492.21, 250/492.22
See application file for complete search history.

(56) References Cited

U.S. PATENT DOCUMENTS

| | | | |
|---|---|---|---|
| 4,283,631 A | 8/1981 | Turner | |
| 4,736,107 A * | 4/1988 | Myron | 250/492.2 |
| 5,099,130 A | 3/1992 | Aitken | |
| 6,908,836 B2 | 6/2005 | Murrell et al. | |
| 6,992,308 B2 * | 1/2006 | Graf et al. | 250/492.21 |
| 7,176,470 B1 | 2/2007 | Evans et al. | |
| 7,498,590 B2 | 3/2009 | Dzengeleski | |
| 2004/0232350 A1 | 11/2004 | Iwasawa et al. | |
| 2005/0189500 A1 | 9/2005 | Graf et al. | |
| 2005/0253089 A1 | 11/2005 | Maeno et al. | |
| 2005/0269527 A1 | 12/2005 | Murrell et al. | |
| 2006/0017017 A1 | 1/2006 | Itokawa et al. | |
| 2008/0067436 A1 | 3/2008 | Vanderberg et al. | |

(Continued)

OTHER PUBLICATIONS

U.S. Appl. No. 13/077,112, filed Mar. 31, 2011.

(Continued)

*Primary Examiner* — Jack Berman
*Assistant Examiner* — Wyatt Stoffa
(74) *Attorney, Agent, or Firm* — Eschweiler & Associates, LLC

(57) ABSTRACT

An ion implantation system includes a beamline configured to direct an ion beam toward an end station configured to hold or support a workpiece, and a scanning system. The scanning system is configured to scan the end station past the ion beam in a two-dimensional fashion comprising a first scan axis along a first direction and a second scan axis along a second direction that is different than the first direction. The system further includes a supplemental scanning component operably associated with the scanning system, and configured to effectuate a scanning of the ion beam with respect to the end station along a third scan axis having a third direction that is different than the first direction.

6 Claims, 9 Drawing Sheets

(56) References Cited

U.S. PATENT DOCUMENTS

| | | | |
|---|---|---|---|
| 2008/0073575 A1* | 3/2008 | Dzengeleski | 250/492.21 |
| 2008/0078955 A1* | 4/2008 | Graf et al. | 250/492.21 |
| 2010/0218286 A1* | 8/2010 | Lai et al. | 850/6 |
| 2011/0029117 A1 | 2/2011 | Tsuji | |
| 2011/0086500 A1 | 4/2011 | Yoneda et al. | |

OTHER PUBLICATIONS

U.S. Appl. No. 13/077,329, filed Mar. 31, 2011.

Non-Final Office Action Dated Aug. 13, 2012 for U.S. Appl. No. 13/077,329. 30 Pages.

Notice of allowance dated Oct. 29, 2012 for U.S. Appl. No. 13/077,112.

Non-Final Office Action dated Jul. 10, 2012 for U.S. Appl. No. 13/077,112. 27 Pages.

Notice of allowance dated Dec. 26, 2012 for U.S. Appl. No. 13/077,329.

Office Action dated Apr. 10, 2013 for U.S. Appl. No. 13/713,251.

Notice of Allowance dated Oct. 9, 2013 for U.S. Appl. No. 13/713,251. 20 Pages.

* cited by examiner

USE OF BEAM SCANNING TO IMPROVE UNIFORMITY AND PRODUCTIVITY OF A 2D MECHANICAL SCAN IMPLANTATION SYSTEM

REFERENCE TO RELATED APPLICATION

This application claims priority to and the benefit of U.S. Provisional Application Ser. No. 61/222,671 which was filed Jul. 2, 2009, entitled USE OF BEAM SCANNING TO IMPROVE UNIFORMITY AND PRODUCTIVITY OF A 2D MECHANICAL SCAN IMPLANTATION SYSTEM, the entirety of which is hereby incorporated by reference as if fully set forth herein.

FIELD OF THE INVENTION

The present invention relates generally to ion implantation systems and methods associated therewith, and more specifically to a system and method for improving uniformity and productivity of a 2D mechanical scan implantation system.

BACKGROUND OF THE INVENTION

In the semiconductor industry, various manufacturing processes are typically carried out on a substrate (e.g., a semiconductor wafer) in order to achieve various results on the substrate. Processes such as ion implantation, for example, can be performed in order to obtain a particular characteristic on or within the substrate, such as limiting a diffusivity of a dielectric layer on the substrate by implanting a specific type of ion. In the past, ion implantation processes were performed in a batch process, wherein multiple substrates were processed simultaneously by being placed on a disk and rotated at high speed past a stationary ion beam to constitute one dimension of the scan, while the rotating disk itself was translated to provide a second scanning axis. Later implantation system employed a serial process, wherein a single substrate is individually processed.

In a typical serial process an ion beam is either scanned in a single axis across a stationary wafer, wherein the wafer is translated in one direction past a fan-shaped, or scanned ion beam, or the wafer is translated in generally orthogonal axes with respect to a stationary ion beam or "spot beam".

Translating the wafer in generally orthogonal axes requires a uniform translation and/or rotation of the wafer in order to provide a uniform ion implantation across the wafer. Furthermore, such a translation should occur in an expedient manner, in order to provide acceptable wafer throughput in the ion implantation process. Due to the slower reciprocating motion of the workpiece, the two dimensional scanning system is not capable of the same scanning speeds as the batch tools. Further, because of this slower scan speed the number of scan lines across the wafer is reduced, and therefore the micro-uniformity of the dose across the wafer is an issue to be considered.

One prior art attempt to address the micro-uniformity issue was to select the pitch of the scan lines based on a beam measurement and prediction of the resultant uniformity. Although this solution can be effective for controlling uniformity, it has a disadvantage that the decreasing the pitch of the scan lines increases the total implant time because of the corresponding greater number scan passes required to completely scan the workpiece. Thus the prior art solution provides for sufficient uniformity, but such improvement comes at the expense of a decrease in the productivity of the tool.

Accordingly, there is a need for improvement in two dimensional scanning systems.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

According to one embodiment of the invention an ion implantation system comprises a beamline that is configured to direct an ion beam toward an end station that is configured to hold or support a workpiece. A scanning system is operably associated with the end station and is configured to scan the end station past the ion beam in a two-dimensional fashion, wherein the two-dimensional scanning comprises first and second scan axes along respective first and second directions that differ from one another. The ion implantation system further comprises a supplemental scanning system that is configured to effectuate a scanning of the ion beam with respect to the end station along a third scan axis having a third direction that is different than the first direction.

According to one embodiment of the invention, the supplemental scanning system provides a dithering of the ion beam in a direction that is different than a fast scan direction of the end station. Further, in one embodiment a frequency of the dithering is substantially greater than a fast scan frequency of the end station, thereby resulting in an ion beam profile along the fast scan axis that is larger than the ion beam itself. The increased ion beam profile or "scan width" provides for improved dose uniformity without a loss of system productivity or throughput.

According to another embodiment of the invention, a method of implanting a workpiece is provided. The method comprises directing an ion beam toward an end station that is configured to hold or support the workpiece, and scanning the end station two-dimensionally with respect to the incoming ion beam. The two-dimensional scanning comprises scanning the end station along a fast scan axis having a fast scan direction and along a slow scan axis having a slow scan direction that are different from one another. The method further comprises scanning the ion beam in a supplemental fashion along another axis having a direction that is different than the fast scan direction. This supplemental scanning is performed while the end station is being scanned past the ion beam in the fast scan direction, thereby increasing an effective scan width of the ion beam during mechanical scanning.

In one embodiment of the invention the scanning of the ion beam in the supplemental fashion comprises scanning the ion beam along the another axis in a non-linear fashion. In another embodiment, a frequency of scanning the ion beam along the another axis is performed at a substantially greater frequency than a frequency of the scanning of the end station in the fast scan direction. In still another embodiment, the fast scan direction and the slow scan direction are generally orthogonal to one another, and the scanning of the ion beam in the another axis is non-parallel to the fast scan direction.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
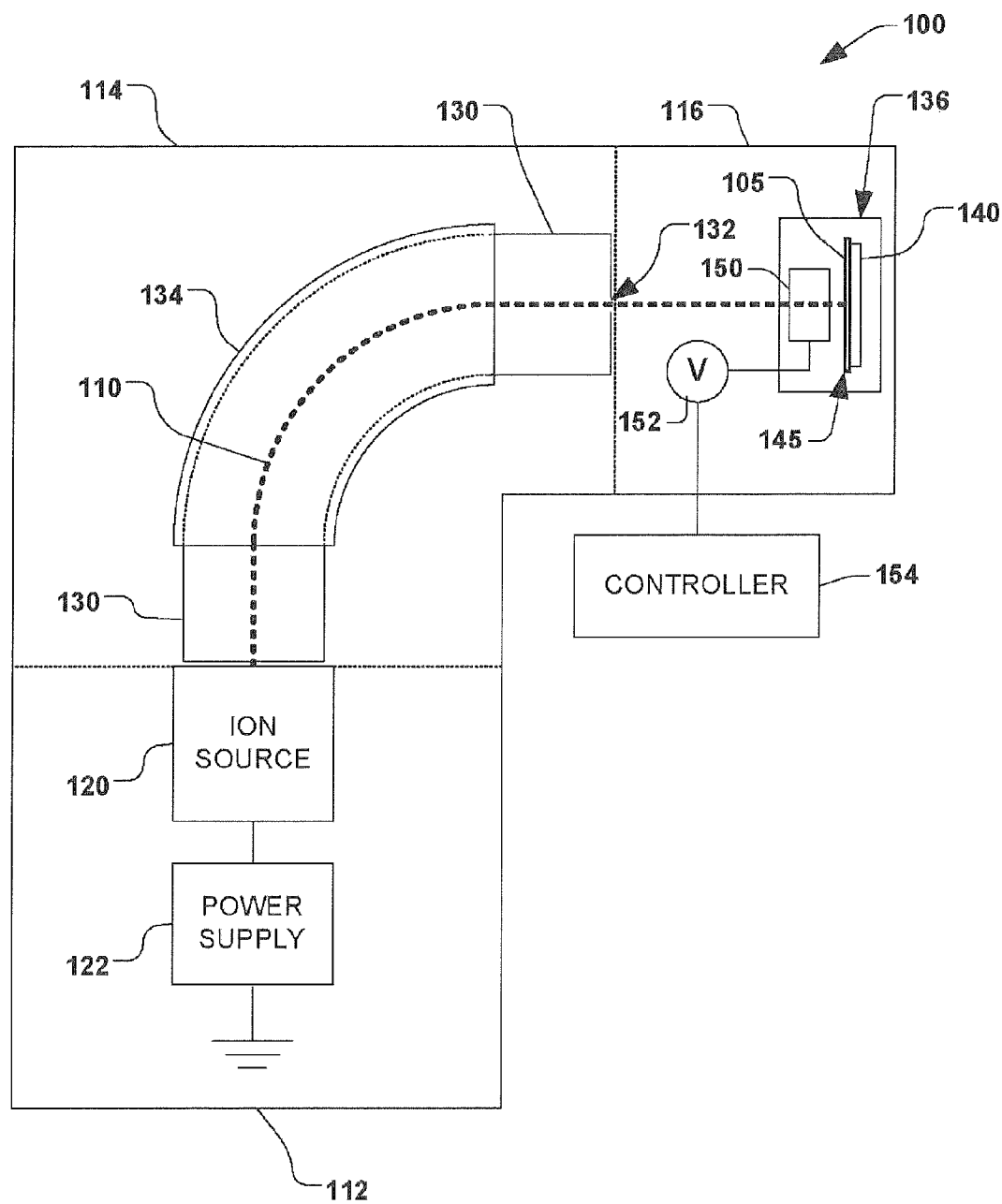
FIG. 1 is a system level diagram illustrating an ion implantation system having a supplemental scanning component according to one embodiment of the invention.

The present invention is directed generally toward a system and method of improving dose uniformity without substantially affecting tool productivity. More particularly, the present invention is directed to an ion implantation system and associated method wherein a scanning system scans the end station with respect to an incoming ion beam in a two-dimensional fashion. That is, the scanning system is configured to mechanically move the end station along a fast scan axis having a fast scan direction, and along a slow scan axis having a slow scan direction. The present invention further comprises a supplemental scanning system or component that is configured to dither the ion beam along a third axis that differs from the fast scan axis. Thus as the end station scans along the fast scan axis in the fast scan direction, the ion beam is scanned along a third or dither axis that differs from the fast scan direction. The dithering of the ion beam alters the "effective" scan width of the ion beam.

The present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one exemplary aspect of the present invention, FIG. 1 illustrates an exemplary two-dimensional mechanically-scanned single-substrate ion implantation system 100, wherein the system is operable to mechanically scan a workpiece 105 through an ion beam 110. As stated above, various aspects of the present invention may be implemented in association with any type of ion implantation apparatus, including, but not limited, to the exemplary system 100 of FIG. 1. The exemplary ion implantation system 100 comprises a terminal 112, a beamline assembly 114, and an end station 116 that forms a process chamber in which the ion beam 110 is directed to a workpiece location. An ion source 120 in the terminal 112 is powered by a power supply 122 to provide an extracted ion beam 110 to the beamline assembly 114, wherein the source 120 comprises one or more extraction electrodes (not shown) to extract ions from the source chamber and thereby to direct the extracted ion beam 110 toward the beamline assembly 114.

The beamline assembly 114, for example, comprises a beamguide 130 having an entrance near the source 120 and an exit with a resolving aperture 132, as well as a mass analyzer 134 that receives the extracted ion beam 110 and creates a dipole magnetic field to pass only ions of appropriate mass-to-energy ratio or range thereof (e.g., a mass analyzed ion beam 110 having ions of a desired mass range). The beamguide 130 directs the mass-analyzed beam 110 through the resolving aperture 132 to the workpiece 105 on a workpiece scanning system 136 associated with the end station 116. Various beam forming and shaping structures (not shown) associated with the beamline assembly 114 may be further provided to maintain and bound the ion beam 110 when the ion beam is transported along a beam path to the workpiece 105 supported on the end station 116 of the workpiece scanning system 136.

Figure 2:
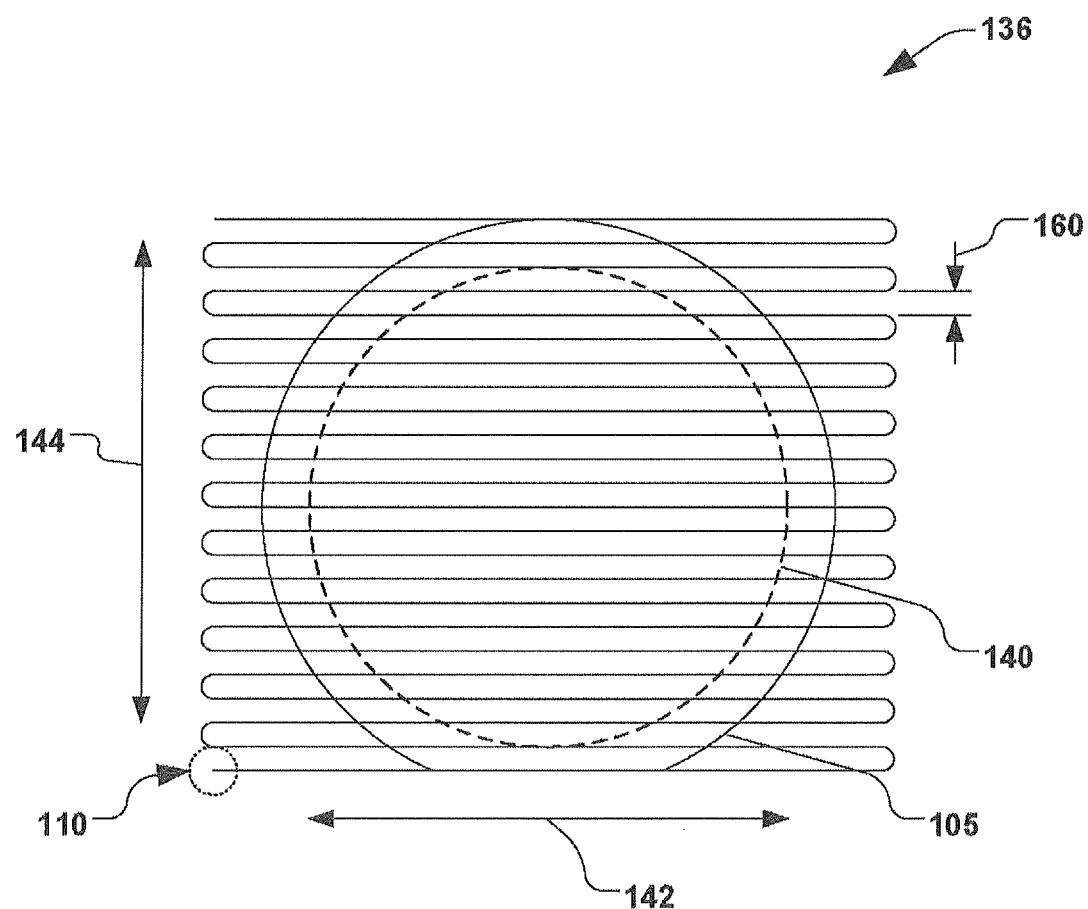
FIG. 2 is a plan view of an end station holding a workpiece thereon that is scanning in a two-dimensional scan pattern with respect to a fixed beam.

The end station 116 illustrated in FIG. 1, for example, is a "serial" type end station that provides an evacuated process chamber in which the single workpiece 105 (e.g., a semiconductor wafer, display panel, or other substrate) is supported along the beam path for implantation with ions. According to one exemplary aspect of the present invention, the single-substrate ion implantation system 100 provides a generally stationary ion beam 110 (e.g., also referred to as a "spot beam" or "pencil beam"), wherein the workpiece scanning system 136 generally translates the end station 116 (or movable stage 140 associated therewith) holding or supporting the workpiece 105 in two generally orthogonal axes with respect to the stationary ion beam. FIG. 2 illustrates a plan view of the exemplary workpiece scanning system 136 when viewed from the trajectory of the ion beam 110. The workpiece scanning system 136, for example, comprises the movable stage 140 whereon the workpiece 105 resides, wherein the stage is operable to translate the workpiece along a fast scan axis 142 and a generally orthogonal slow scan axis 144 with respect to the ion beam 110. A speed of the workpiece 105 along the fast scan axis 142 (also referred to as the "fast scan direction") is significantly faster than a speed of the substrate along the slow scan axis 144 (also referred to as the "slow scan direction"). For convenience, the speed of the substrate 105 along the fast scan axis 142 will be referred to as "fast scan speed", and the speed of the substrate along the slow scan axis 144 will be referred to as "slow scan speed".

Referring back to FIG. 1, the ion implantation system 100 further comprises a supplemental scanning system 150 upstream of the workpiece 105. In the embodiment illustrated in FIG. 1 the supplemental scanning system 150 resides within the workpiece scanning system 136. In alternative embodiments, however, the supplemental scanning system 150 may reside further upstream, and be located anywhere between the exit of the mass analyzer 134 and the workpiece 105. The supplemental scanning system is operable to dither the ion beam 110 along about the fast scan axis 142 as the scanning system 136 translates the workpiece 105 along the fast scan direction, thereby increasing the "effective size" of the beam in a time-averaged sense. In other words, the supplemental scanning system provides an additional, or third, scanning axis for the ion beam with respect to the workpiece, and such additional movement of the ion beam with respect to the workpiece serves to average the beam profile and reduce the effect of any beam hot spots, thereby improving beam dose uniformity across the workpiece.

In one embodiment of the invention, the supplemental scanning system 150 is selectively activatable such that in one mode of operation the supplemental scanning system 150 operates to provide the additional dithering motion of the beam 110, while in another mode of operation the system 150 is off or inactive and exerts no additional forces on the ion beam. In one embodiment the two modes of operation are controlled in conjunction with a power supply 152 and a controller 154.

The traditional two-dimensional mechanical scanning system has the advantage of a relatively sample spot beam type beamline, wherein the ion beam size and position is fixed and the workpiece is translated in front of the beam. While the fast scan speed is faster than the slow scan speed, the fast scan speed is still relatively slow (e.g., 1-2 Hz) compared to previous spinning disk batch type systems. Because of the relatively slow scan speed the total number of scan lines across the wafer is reduced, and thus micro-uniformity with respect to dose distribution about the workpiece is an issue to be considered. While decreasing the pitch 160 (i.e., the distance between neighboring scans along the fast scan axis) may improve micro-uniformity, such a decrease in pitch results in an increase in the number of total scan passes and thus decreases the productivity of the tool.

Figure 3:
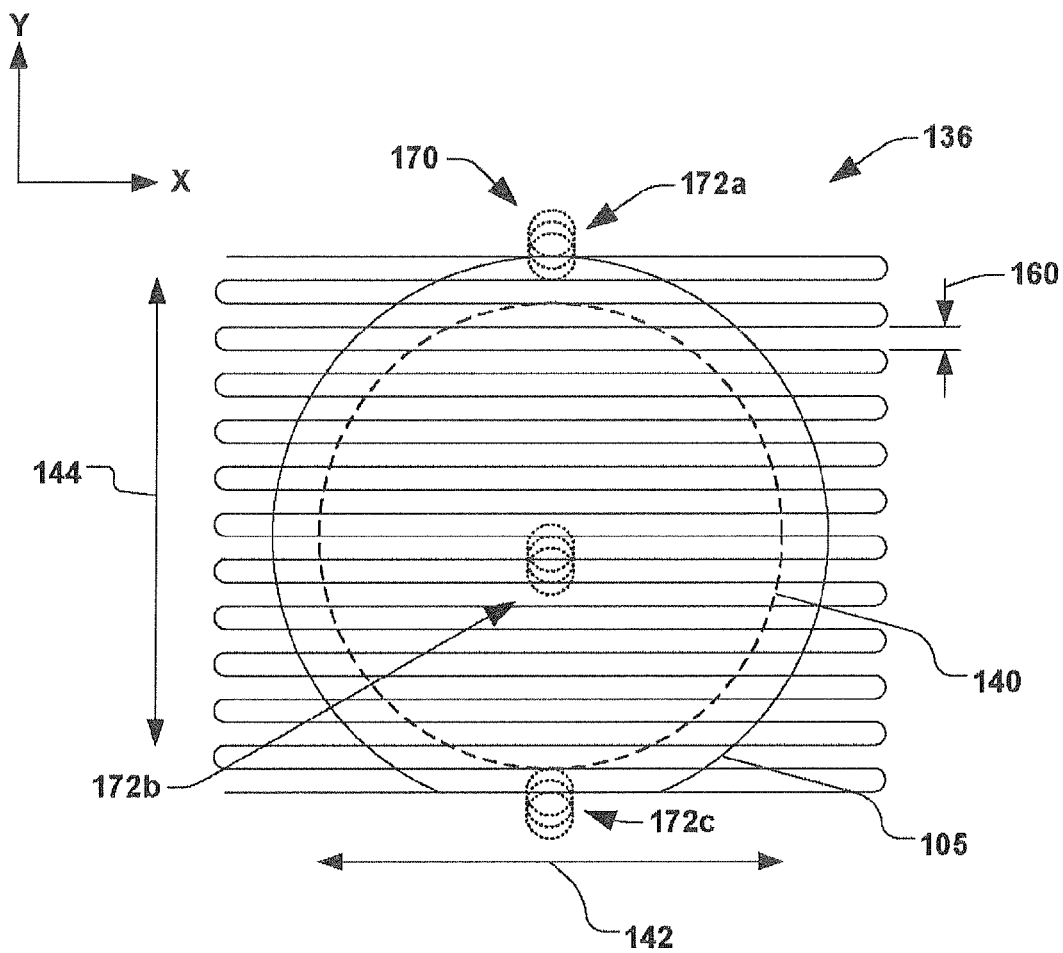
FIG. 3 is a plan view of an end station holding a workpiece thereon that is scanning in a two-dimensional scan pattern with respect to an ion beam that is being dithered along a third axis having a direction that is different than a fast scan direction according to one embodiment of the invention.
Figure 4:
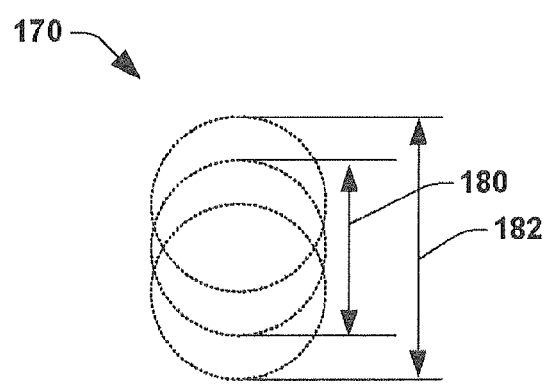
FIG. 4 is a phantom type diagram illustrating an ion beam that is dithered along a third axis resulting in a time-averaged effective beam that is larger than a corresponding fixed ion beam.

As will be more fully appreciated in conjunction with FIGS. 3 and 4, the present invention adds a third scanning axis that in one embodiment constitutes a small motion of the beam in a direction non-parallel to the fast scan axis 142, that averages the beam profile and reduces the effect of ion beam hot spots, and increases the effective size of the beam to allow for a larger scan pitch, and thus higher tool productivity with concurrent improvement in dose micro-uniformity.

Referring to FIG. 3, a plan view of the scanning system 136 that incorporates the supplemental scanning system 150 is provided wherein the ion beam 170 of the present invention is illustrated at three different locations 172a, 172b, 172c, representing a location of the ion beam with respect to the workpiece 105 at three different time periods. As can be seen in FIG. 3, the ion beam 170 is illustrated in phantom representing three example positions as the beam has been dithered about a given portion of the fast scan axis 142 by the supplemental scanning system 150 of FIG. 1. That is, the supplemental scanning system 150 in one embodiment causes the ion beam 170 to dither in a direction generally orthogonal to the direction of the fast scan axis 142.

Further, while the scan speed of the fast scan along the fast scan axis in one embodiment is a first scan frequency (e.g., 1-2 Hz), the dither frequency, a second frequency, is substantially greater (e.g., 50-100 Hz). In the above manner, the dither movement of the ion beam results in a time-averaged change in the shape of the ion beam 170, wherein the three phantom circles tend to merge to form an extended elliptical shape. This feature is best understood in conjunction with FIG. 4, wherein an initial beam shape has a first dimension 180, while the time-averaged dithered beam 170 exhibits a second, enlarged dimension 182. The larger effective beam shape (or scan width) allows for a larger scan pitch 160, and thus a reduced number of scan lines may be permitted to fully scan the workpiece 105. While FIGS. 3 and 4 show as an example the ion beam prior to dithering to be circular, it should be understood that the initial shape may differ. Further, while the dithered beam is shown as an extended ellipse, it should be understood that the dithering may change the shape in various ways, and that any shape having an effectively larger beam size footprint (in a time-averaged sense) is contemplated as falling within the scope of the present invention.

While the dithering of the ion beam 170 in FIG. 3 is illustrated as being in the "Y" direction, orthogonal to the fast scan direction "X", it should be understood that the dithering axis or third axis of the present invention may be in any direction that is non-parallel to the fast scan direction. Therefore if the fast scan direction constitutes a first direction, the slow scan direction constitutes a second direction, and the dithering direction of the ion beam constitutes a third direction, then the first and third directions are different and non-parallel.

Figure 5A:
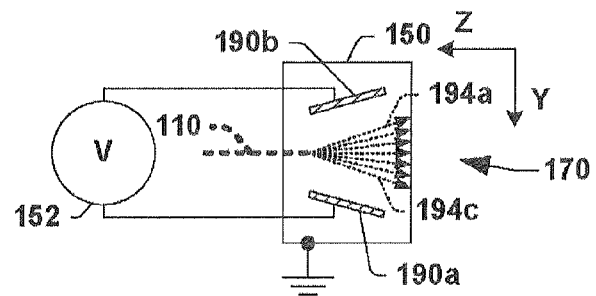
FIG. 5A is a diagram illustrating an electrostatic type supplemental scanning system configured to dither an ion beam along a third axis that is different than a fast scan axis of a two-dimensional scanning system according to one embodiment of the invention.

Any type of apparatus operable to dither the ion beam 170 as described above in conjunction with FIGS. 3 and 4 is contemplated as falling within the scope of the present invention. In one embodiment the supplemental scanning system 150 of FIG. 1 comprises an electrostatic type scanning system, as illustrated in FIG. 5A. In one embodiment, the electrostatic version of the supplemental scanning system 150 comprises a pair of scan plates or electrodes 190a and 190b on the top and bottom sides of the beam path, and a voltage source 152 that provides alternating voltages to the electrodes 190a and 190b, as illustrated, for example, in the waveform diagram 200 in FIG. 5B. The time-varying voltage 201 between the scan electrodes 190a and 190b creates a time varying electric field across the beam path therebetween, by which the beam 110 is bent or deflected (e.g., scanned) along a third axis scan direction (e.g., the Y direction in FIGS. 5A and 5C). When the scanner electric field is in the direction from the electrode 190a to the electrode 190b (e.g., the potential of electrode 190a is more positive than the potential of electrode 190b, such as at time "c" in FIG. 5B), the positively charged ions of the beam 110 are subjected to a force in the negative Y direction (e.g., toward the electrode 190b). When the electrodes 190a and 190b are at the same potential (e.g., zero electric field in the supplemental scanning system 150, such as at time "b" in FIG. 5B), the beam 110 passes through the supplemental scanning system 150 unmodified. When the field is in the direction from the electrode 190b to the electrode 190a (e.g., time "a" in FIG. 5B), the positively charged ions of the beam 110 are subjected to a lateral force in the positive Y direction (e.g., toward the electrode 190a).

Figure 5B:
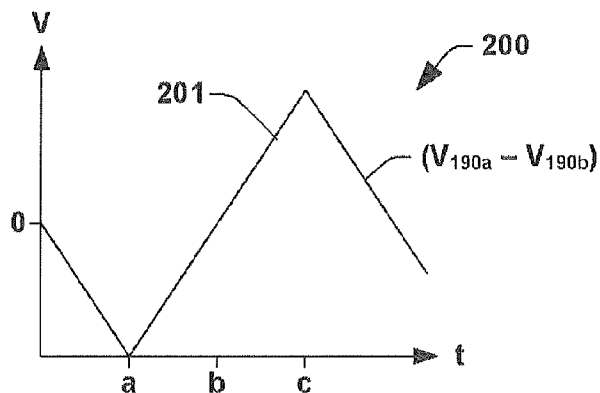
FIG. 5B is a waveform diagram illustrating a potential between scanning plates of an electrostatic type supplemental scanning system, wherein the linear type scanning waveform is operable to dither the ion beam along a third axis in a relatively linear fashion according to one embodiment of the invention.
Figure 5C:
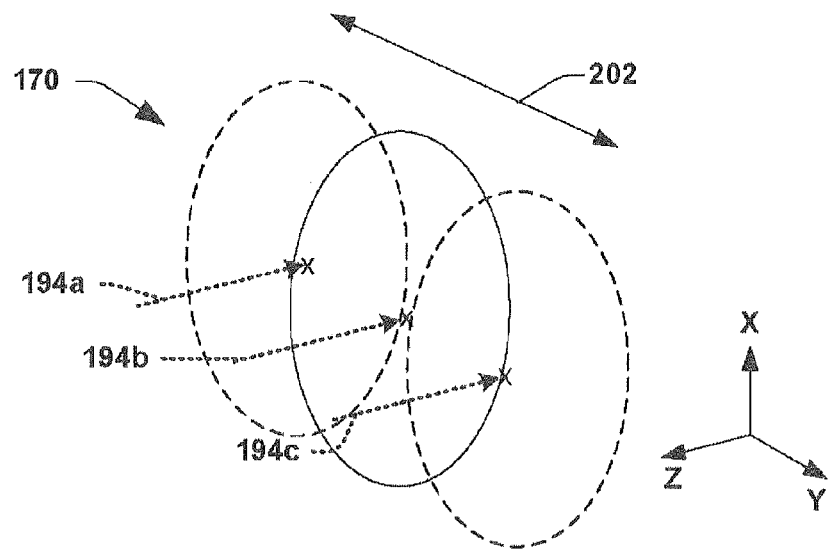
FIG. 5C illustrates a dither movement of the ion beam back and forth along a third axis as a result of the scanning waveform of FIG. 5B according to one embodiment of the invention.

Thus as a voltage waveform 201 such as that illustrated in FIG. 5B is applied across the electrodes 190a and 190b of FIG. 5A, the ion beam 110 will move back and forth along a third axis 202 (e.g., a dither axis) as illustrated in FIG. 5C to form a time-averaged beam 170. By altering the voltage waveform 201 the extent and/or frequency of the ion beam dithering may be adjusted or tuned. Consequently, the "effective" size or shape of the ion beam 170 may be varied or controlled as desired.

While FIG. 5A illustrates an electrostatic type supplemental scanning system 150, it should also be understood that other types of scanning components may be employed and are contemplated as falling within the scope of the present invention. For example, the supplemental scanning system 150 may comprise a magnetic type scanning system having coils that are driving with a current waveform to generate an alternating magnetic field to influence the ion beam to effectuate the desired dither.

In order to more fully appreciate the various advantages associated with the invention, a comparison will be made to a two-dimensional system that has no supplemental scanning system 150 or to an implant system of FIG. 1 in which the supplemental scanning system 150 is deactivated. Referring to FIG. 2 with such a two-dimensional scan pattern, for a given pitch 160 the total implant time for a single pass over the entire workpiece can be estimated as:

Implant time=$(W+Bx)/Vx*N+2*Vx/Ax*(N-1)$, where N=(W+By)/P (rounded up to provide a discrete number of passes), and wherein: P=scan pitch, N=# of scan lines, Ax=fast scan acceleration, Vx=fast scan speed, Bx=horizontal beam size, By=vertical beam size, and W=wafer size.

Figure 6:
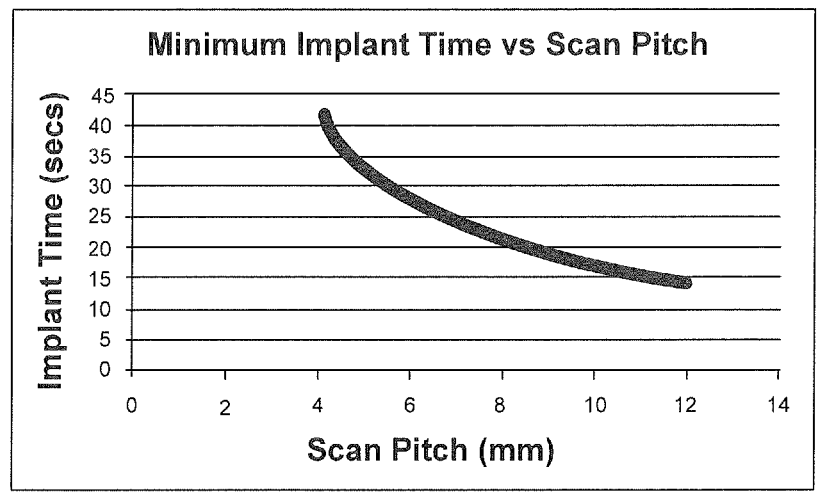
FIG. 6 is a graph illustrating a relationship between the scan pitch in a two-dimensional scanning system and the total implant time needed to scan an entire workpiece.

While the selection of scan pitch (P) has a significant effect on uniformity, decreasing the scan pitch (P) to improve uniformity increases the implant time. This characteristic is readily appreciated in FIG. 6. In FIG. 6, for a 300 mm workpiece, a beam size of Bx=By=100 mm, and a fast scan speed Vx=1.5 m/sec, and a fast scan acceleration (Ax)=2 g, one can clearly see that as the scan pitch decreases from about 12 mm to about 4 mm, the total implant time increases from about 14 sec to about 42 sec.

Figure 7:
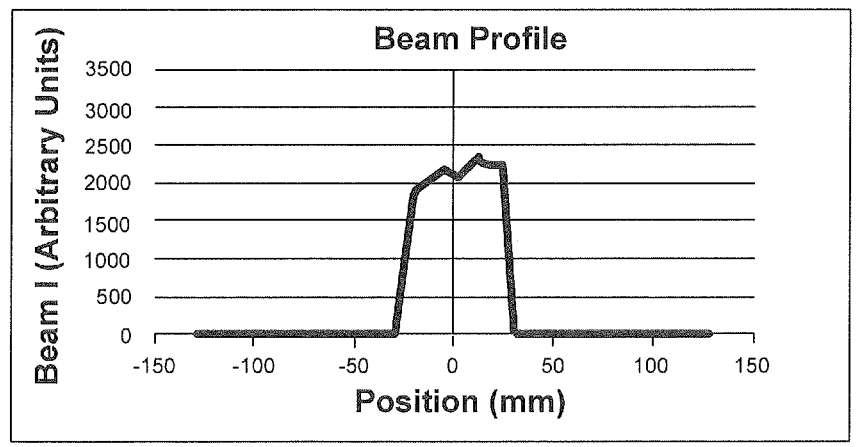
FIG. 7 is a graph illustrating one example of an ion beam profile with respect to position.
Figure 8:
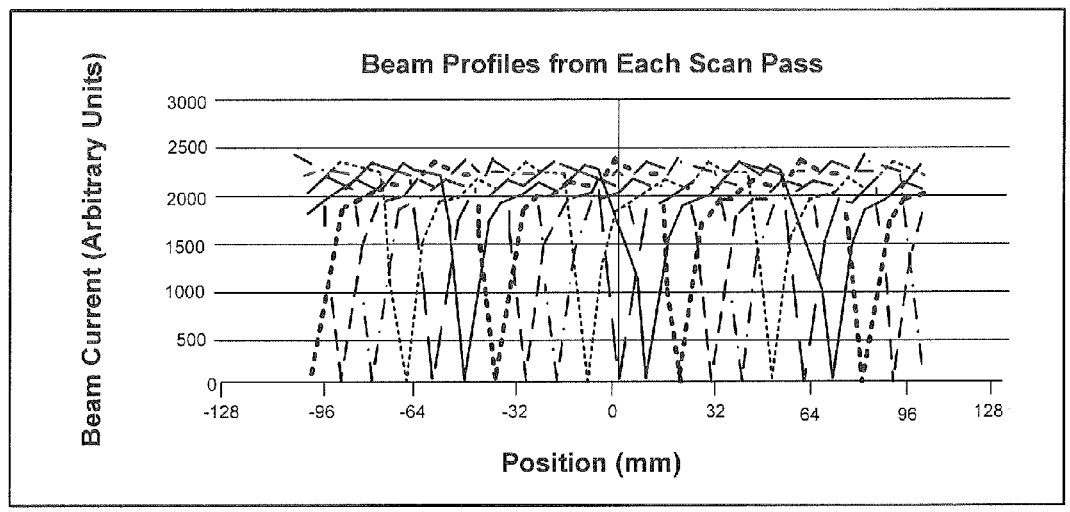
FIG. 8 is a graph illustrating one example of overlapping ion beam profiles from multiple ion beam passes in a two-dimensional scanning system.
Figure 9:
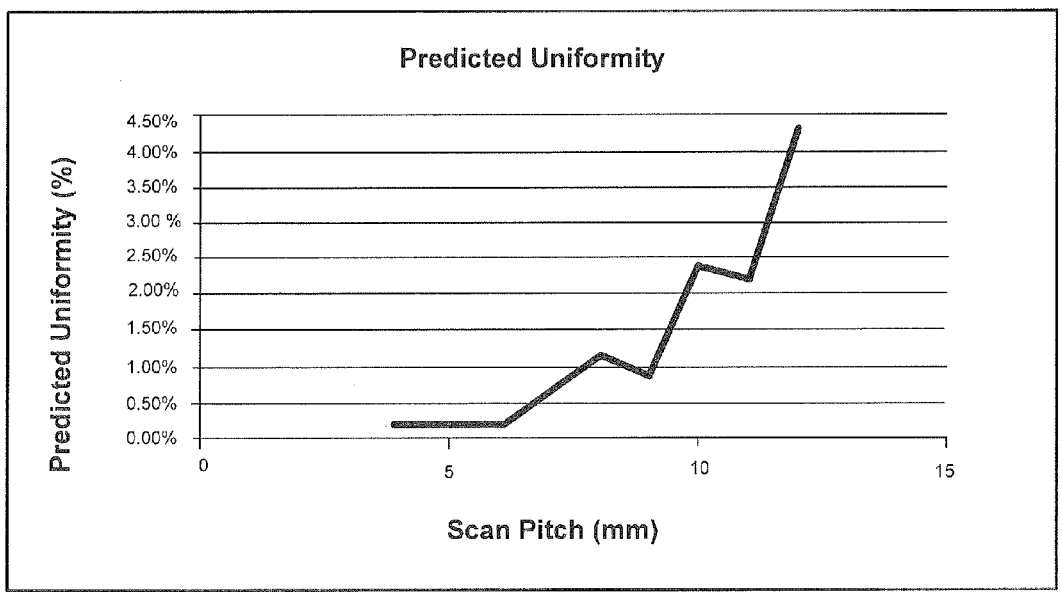
FIG. 9 is a graph illustrating a relationship between the scan pitch in a two-dimensional scanning system and a predicted ion dose uniformity across a workpiece.

Further, for a given beam size (Bx, By) and scan pitch (P), dose uniformity can be estimated by dividing the scan pitch into a number of points and summing the beam current from each scan pass that is within the beam width of the point. FIGS. 7 and 8 illustrate an example of a beam profile and a depiction of that beam stepped across a workpiece for multiple scan passes. Consequently, the dose uniformity is a function of scan pitch and can be predicted or estimated, wherein the uniformity, in one example, is described as the standard deviation of the dose profile within each scan pitch. As would then be expected, as the scan pitch is decreased and more beam overlap occurs for each scan pass, the predicted dose uniformity improves, as illustrated in FIG. 9.

Figure 10:
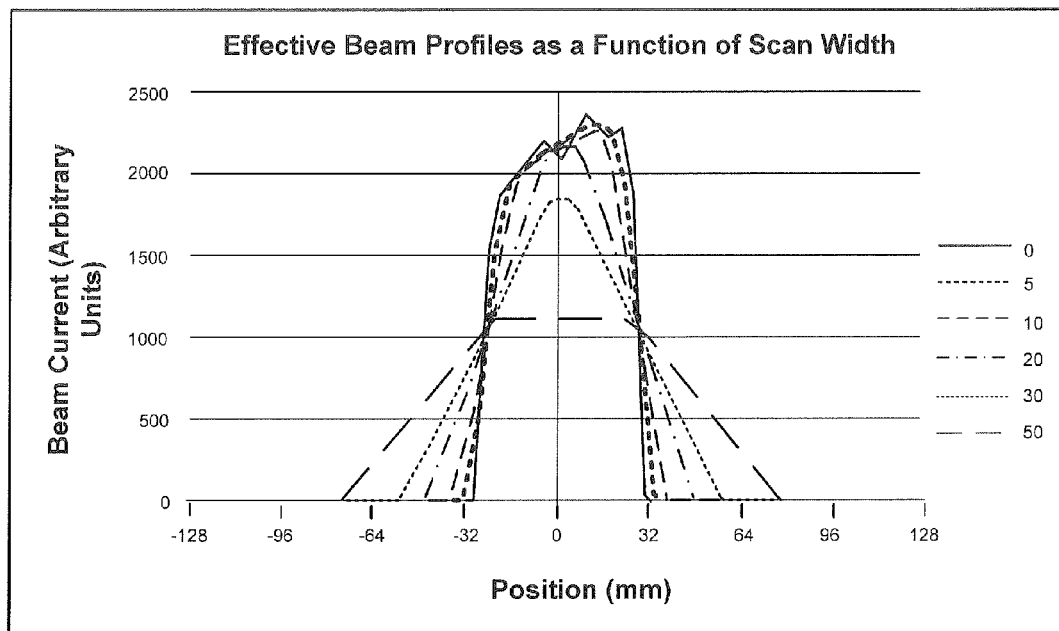
FIG. 10 is a graph illustrating how a change in scan width of an ion beam by dithering the ion beam along a third axis results in differing effective beam profiles according to one embodiment of the invention.

As highlighted above in conjunction with FIGS. 1-4, the present invention introduces a third dithering axis of the ion beam at a dither frequency that is substantially greater than the fast scan frequency. Consequently, in a time-averaged sense, the dithering produces a new beam profile. For purposes of illustration the scan width (new beam profile) of the beam is defined as the beam size +/− the distance the beam is dithered (resulting in the size 182 of FIG. 4). FIG. 10 illustrates a plurality of different "effective" beam profiles resulting from dithering as a function of a different dithering amount (0 to +/−50 mm) resulting in different total scan widths 182. As can be seen in FIG. 10, as the scan width increases the effective beam profile gets smoother, resulting in a reduction of beam hot spots. The resulting smoother beam profile further results in improved dose uniformity.

Figure 11:
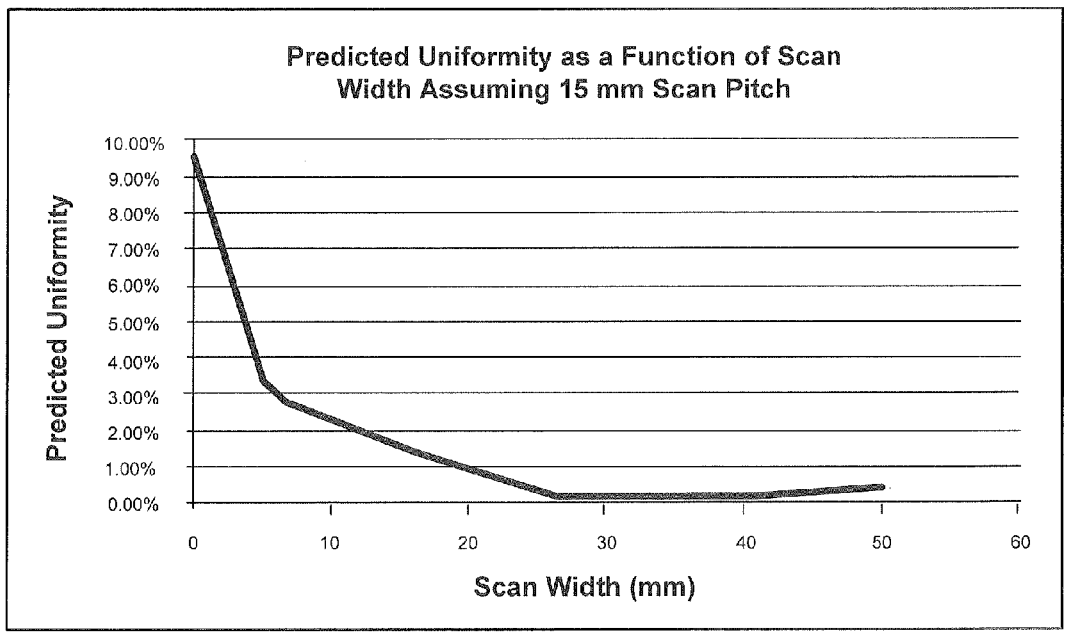
FIG. 11 is a graph illustrating a predicted uniformity as a function of scan width due to dithering of the ion beam according to an embodiment of the invention.

Referring to FIG. 11, for a fixed pitch of 15 mm, the improvement caused by dithering the ion beam is shown. While a beam with no dithering (e.g., beam 180 of FIG. 4) shows a predicted uniformity variation for a pitch size of 15 mm to be more than 9%, as the scan width is increased (more dithering), the uniformity improves. For example, for a dithering of +/−10 mm, the uniformity improves to about 2.25%, and for a dithering of +/−30 mm, the uniformity goes to almost 0%, as would be optimally desired.

Figure 12:
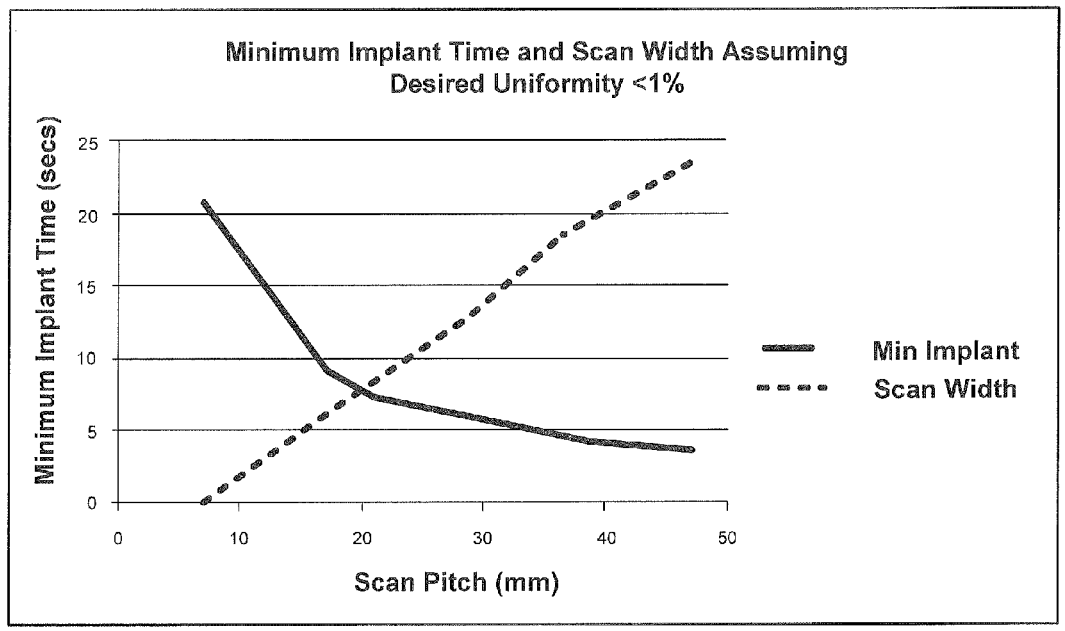
FIG. 12 is a graph illustrating an interrelationship between a minimum implant time and a scan width due to dithering according to one embodiment of the invention.

It should be noted that although the supplemental scanning system 150 improves uniformity for a given scan pitch, the larger effective beam size requires more overscan in the regions 172a and 172c of FIG. 3 to ensure uniformity at the workpiece edges, and consequently for a given scan pitch the total implant time may increase. Therefore it is desirable to optimize the total implant time by selecting a scan pitch and scan width that produce the desired uniformity with the least implant time. FIG. 12 illustrates a graph providing the requisite scan pitch and scan width for a desired uniformity of <1%. As can be seen the minimum implant time is still trending down at a very large scan pitch, however, the shape of that curve will depend on the details of the mechanical two-dimensional scanning system 136. Further, in those instances where improved dose uniformity comes at the expense of too much implant time increase, the supplemental scanning system 150 of FIG. 1 can be selectively deactivated, and the ion beam 110 without dithering may impact directly the end station being scanning past the beam.

Figure 13:
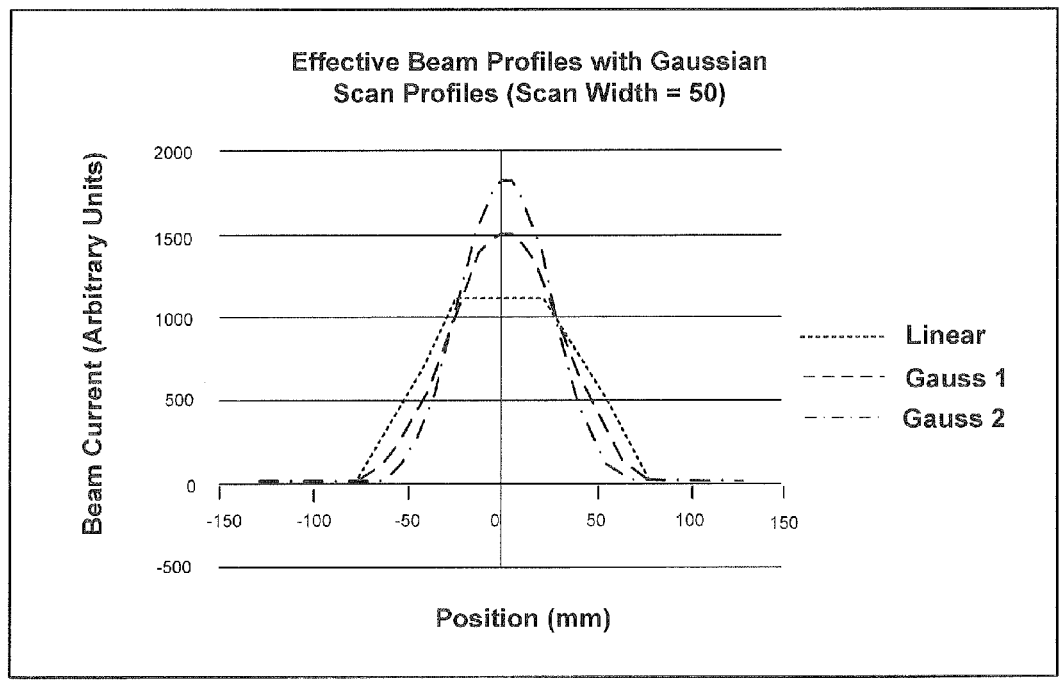
FIG. 13 is a graph illustrating a plurality of effective ion beam profiles due to dithering according to the invention, wherein one curve illustrating a linear type dithering movement of the ion beam along a third axis, and the other two curves illustrate differing non-linear dithering movements according to alternative embodiments of the invention.
Figure 14:
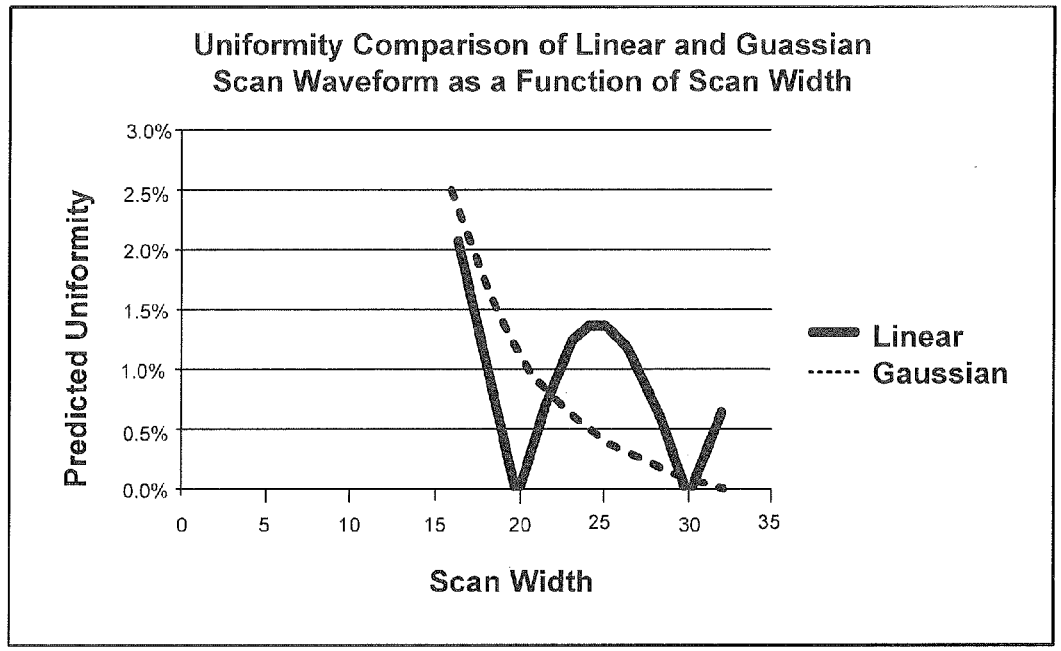
FIG. 14 is a graph illustrating how linear and non-linear dithering movements of the ion beam according to the invention provide differing levels of predicted dose uniformity.

According to another embodiment of the invention, the dithering movement of the ion beam along the third axis may be performed in a non-linear fashion. In the example of FIG. 5B, the voltage waveform that controls the dithering is a linear function, however, non-linear functions may be utilized and such non-linear functions are contemplated as falling within the scope of the present invention. For example, FIG. 13 illustrates different effective beam profiles using different dithering functions, wherein each have the same extent of dithering (+/−50 mm). As can be seen, while the linear dither provides a tighter distribution (a higher standard deviation), the Gaussian control functions provide more spatial beam uniformity about its entire scan width, which may be advantageous for improved dose uniformity. This can be further seen in FIG. 14, wherein a uniformity comparison is provided between a linear and Gaussian dither scan waveform as a function of scan width. While the linear function provides improved dose uniformity for selected scan widths, the Gaussian function provides better dose uniformity for other scan widths. Therefore the controller 154 of FIG. 1 may be employed to selectively modify the dither control waveforms as a function of the desired scan width (extent of dither).

Figure 15:
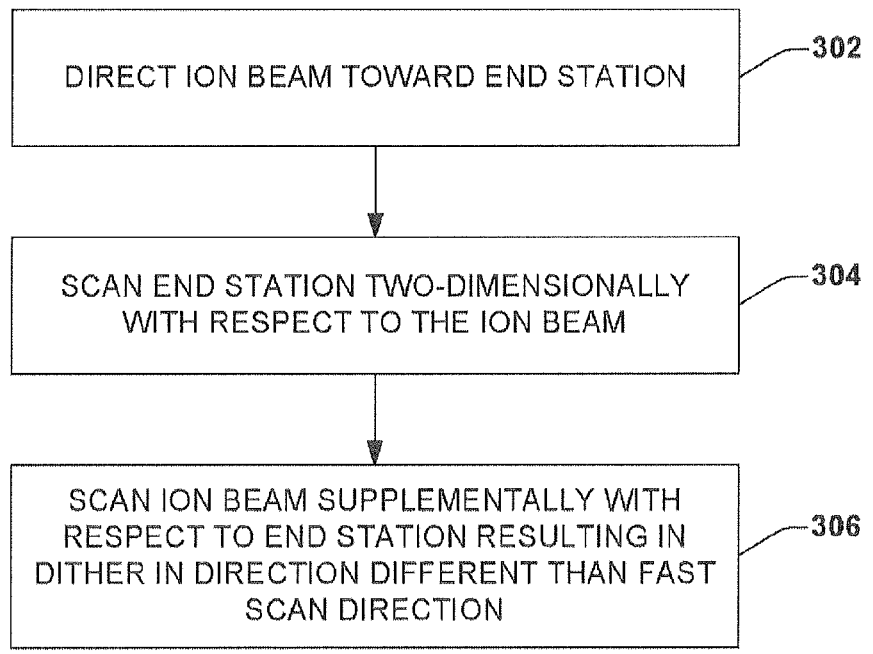
FIG. 15 is a flow chart illustrating a method of improving dose uniformity across a workpiece in a two-dimensional scanning system employing a dithering movement of an ion beam along a third axis having a direction that is different than a fast scan axis direction according to one embodiment of the invention.

According to another embodiment of the present invention, FIG. 15 is a flow chart diagram illustrating an exemplary method 300 of implanting a workpiece. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Referring to FIG. 15, the method 300 comprises directing an ion beam toward an end station at 302. The method 300 further comprises scanning the end station with respect to the ion beam in a two-dimensional manner at 304, wherein the end station is scanned along a fast scan axis having a fast scan direction, and along a slow scan axis having a slow scan direction. The method 300 further comprises scanning the ion beam with respect to the end station along a dither axis having a direction that differs from the fast scan direction at 306. The dithering at 306 causes the ion beam to have an "effective" size that differs from the ion beam itself as the end station scans along the fast scan direction. Thus the method 300 provides for a larger scan width that facilitates improved dose uniformity.

According to another embodiment of the invention the scanning of the ion beam in a supplemental fashion (i.e., the dithering) may be done in a linear or non-linear fashion, and both alternatives are contemplated as falling within the scope of the present invention. Further, a frequency of the dithering, according to one embodiment, is substantially greater than a frequency of the fast scan of the end station along the fast scan axis. Further still, in one embodiment the fast scan and slow scan directions are orthogonal to one another, and the dithering axis of the ion beam is non-parallel to the fast scan direction. Therefore the dithering of the ion beam causes the scan width of the ion beam to be increased as the end station scans along the fast scan direction past the ion beam.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
   a beamline configured to direct an ion beam toward an end station configured to hold or support a workpiece;
   a scanning system configured to scan the end station configured to hold or support the workpiece past the ion beam in a two-dimensional fashion comprising a first scan axis along a first direction and a second scan axis along a second direction that is different than the first direction; and
   a supplemental scanning component operably associated with the scanning system, and configured to effectuate a scanning of the ion beam with respect to the end station along a third scan axis having a third direction that is different than the first direction,
   wherein the supplemental scanning component is configured to selectively scan the ion beam along the third scan axis with one of a linear scan waveform or a non-linear scan waveform as a function of an indicated width of the scanning along the third scan axis.

2. The ion implantation system of claim 1, wherein the supplemental scanning component comprises an electrostatic scanner configured to move the ion beam back and forth along the third scan axis in response to a time-varying electrostatic field.

3. The ion implantation system of claim 1, wherein the supplemental scanning component comprises a magnetic scanner configured to move the ion beam back and forth along the third scan axis in response to a time-varying magnetic field.

4. The ion implantation system of claim 1, wherein the supplemental scanning component is configured to dither the ion beam back and forth along the third scan axis, wherein the third scan axis crosses the first scan axis.

5. The ion implantation system of claim 4, wherein a scan frequency of the scanning system along the first scan axis is a first frequency, and a dither frequency of the ion beam dither along the third scan axis is a second frequency, and wherein the second frequency is greater than the first frequency.

6. The ion implantation system of claim 1, wherein the first and second directions are orthogonal to one another.

* * * * *